(12) United States Patent
Bhagavat et al.

(10) Patent No.: US 9,601,395 B2
(45) Date of Patent: Mar. 21, 2017

(54) METHODS FOR POST-EPITAXIAL WARP PREDICTION AND CONTROL

(71) Applicant: SunEdison Semiconductor Limited (UEN201334164H), Singapore (SG)

(72) Inventors: Sumeet S. Bhagavat, St. Charles, MO (US); Roland R. Vandamme, Wentzville, MO (US)

(73) Assignee: SunEdison Semiconductor Limited (UEN201334164H), Singapore (SG)

( * ) Notice: Subject to any disclaimer, the term of this patent is extended or adjusted under 35 U.S.C. 154(b) by 0 days.

(21) Appl. No.: 14/758,080

(22) PCT Filed: Dec. 28, 2012

(86) PCT No.: PCT/US2012/071999
§ 371 (c)(1),
(2) Date: Jun. 26, 2015

(87) PCT Pub. No.: WO2014/105044
PCT Pub. Date: Jul. 3, 2014

(65) Prior Publication Data
US 2015/0371909 A1 Dec. 24, 2015

(51) Int. Cl.
*B24B 49/03* (2006.01)
*B24B 7/22* (2006.01)
*H01L 21/66* (2006.01)

(52) U.S. Cl.
CPC ............. *H01L 22/20* (2013.01); *B24B 7/228* (2013.01); *B24B 49/03* (2013.01); *H01L 22/12* (2013.01)

(58) Field of Classification Search
CPC ......... H01L 22/20; H01L 22/12; H01L 22/10; H01L 22/14; H01L 438/11; H01L 22/30;
(Continued)

(56) References Cited

U.S. PATENT DOCUMENTS 5,562,770 A    10/1996    Chen et al.
2008/0166948 A1*  7/2008   Bhagavat ................ B24B 7/228
                                                          451/5
(Continued)

FOREIGN PATENT DOCUMENTS

JP    H06112120 A    4/1994
JP    2001302395 A   10/2001
JP    2008140856 A * 6/2008

OTHER PUBLICATIONS

International Search Report and Written Opinion of the International Searching Authority regarding PCT/US2012/071999 mailed on Sep. 5, 2013; pp. 11.
(Continued)

*Primary Examiner* — Julio J Maldonado
*Assistant Examiner* — Farun Lu
(74) *Attorney, Agent, or Firm* — Armstrong Teasdale LLP

(57) ABSTRACT

In one aspect, a method of predicting warp in a plurality of wafers after an epitaxial layer deposition process is provided. The method includes receiving, by a processor, a measured resistivity of a first wafer of the plurality of wafers, receiving, by the processor, a measured shape of the first wafer after at least one of a grinding process and an etching process, and calculating, using the processor, a change in wafer shape during the epitaxial layer deposition process. The method further includes superposing, using the processor, the calculated shape change onto the measured shape of the first wafer to determine a post-epitaxial wafer shape and calculating, using the processor, a post-epitaxial warp value based on the determined post-epitaxial wafer shape.

11 Claims, 7 Drawing Sheets

(58) Field of Classification Search
CPC ....... H01L 438/14; H01L 22/00; H01L 22/24; H01L 438/18; H01L 21/024; H01L 21/0242; H01L 21/02422; H01L 21/02488; H01L 21/2007; H01L 21/2011; H01L 21/314; H01L 21/31666; H01L 21/31679; H01L 21/3205; H01L 21/32055; H01L 21/32056; H01L 21/26533; H01L 21/02636; H01L 21/2018; H01L 21/2022; B24B 7/228; B24B 49/03; G01R 31/2855; G01R 438/07; G01B 2210/56; H01S 5/0014; H02S 50/00; H02S 438/16; G01N 21/9501

See application file for complete search history.

(56) References Cited

U.S. PATENT DOCUMENTS

2009/0269861 A1    10/2009  Kurosawa
2010/0032806 A1*    2/2010  Kihara ................... B24B 7/228
                                                            257/618

OTHER PUBLICATIONS

Office Action regarding Japanese Patent Application No. 2015-550367; dated Sep. 27, 2016; 8 pgs.

* cited by examiner

METHODS FOR POST-EPITAXIAL WARP PREDICTION AND CONTROL

CROSS-REFERENCE TO RELATED APPLICATIONS

This application is a National Stage application of International Application No. PCT/US2012/071999, filed on Dec. 28, 2012, the disclosure of which is hereby incorporated by reference in its entirety.

FIELD

The field relates generally to processing semiconductor wafers and, more particularly, to predicting and controlling post-epitaxial warp of wafers.

BACKGROUND

Semiconductor wafers are commonly used as substrates in the production of integrated circuit chips. Chip manufacturers require wafers that have extremely flat and parallel surfaces to ensure that a maximum number of chips can be fabricated from each wafer. After being sliced from an ingot, wafers typically undergo grinding and polishing processes designed to improve certain surface features, such as flatness and parallelism.

Simultaneous double side grinding operates on both sides of a wafer at the same time and produces wafers with highly planarized surfaces. Grinders that perform double side grinding include, for example, those manufactured by Koyo Machine Industries Co., Ltd. These grinders use a wafer clamping device to hold the semiconductor wafer during grinding. The clamping device typically comprises a pair of hydrostatic pads and a pair of grinding wheels. The pads and wheels are oriented in opposed relation to hold the wafer therebetween in a vertical orientation. The hydrostatic pads beneficially produce a fluid barrier between the respective pad and wafer surface for holding the wafer without the rigid pads physically contacting the wafer during grinding. This reduces damage to the wafer that may be caused by physical clamping and allows the wafer to move (rotate) tangentially relative to the pad surfaces with less friction. While this grinding process can improve flatness and/or parallelism of the ground wafer surfaces, subsequent processes can impact the wafer and cause topology degradation. For example, as a result of lattice mismatch between a heavily doped substrate and a lightly doped epitaxial layer, a bow and a warp of the wafer changes substantially after the epitaxial layer deposition. Such warp changes may be drastic and result in wafer capability degradation and/or yield losses. As such, undesirable topography features introduced into the wafer by the epitaxial layer deposition cannot be controlled.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

In one aspect, a method of predicting warp in a plurality of wafers after an epitaxial layer deposition process is provided. The method includes receiving, by a processor, a measured resistivity of a first wafer of the plurality of wafers, receiving, by the processor, a measured shape of the first wafer after at least one of a grinding process and an etching process, and calculating, using the processor, a change in wafer shape during the epitaxial layer deposition process. The method further includes superposing, using the processor, the calculated shape change onto the measured shape of the first wafer to determine a post-epitaxial wafer shape and calculating, using the processor, a post-epitaxial warp value based on the determined post-epitaxial wafer shape.

In another aspect, a method of controlling warp in a plurality of wafers that are subject to an epitaxial layer deposition process is provided. The method includes predicting, using a processor, a warp value in a first wafer of the plurality of wafers after the epitaxial layer deposition process, adjusting a wafer grinder based on the predicted warp, and grinding a second wafer of the plurality of wafers with the wafer grinder.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

DETAILED DESCRIPTION

Generally, the systems and methods described herein improve post epitaxial warp of processed wafers by predicting post-epitaxial warp and adjusting grinding processes to optimize the post-epitaxial warp and improve wafer quality and yield. As described below, an algorithm in one embodiment is suitably used to predict post epitaxial warp using data measured after a grinding process and/or an etching process, and a grinder is adjusted based on the predicted post epitaxial warp to alter the surface of subsequent wafers to reduce post-epitaxial warp of the product wafers.

Figure 1:
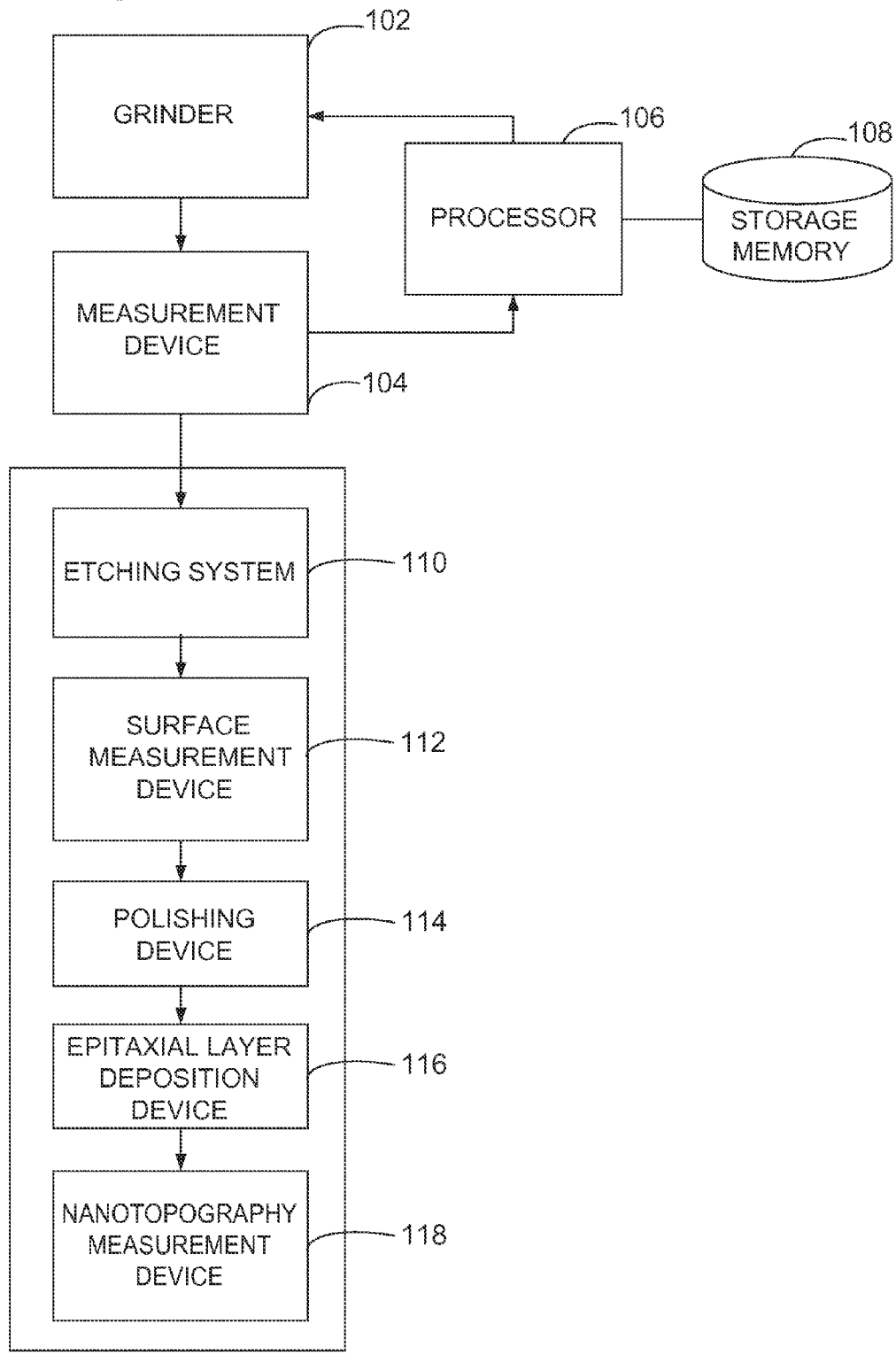
FIG. 1 is a block diagram illustrating one embodiment of a system for processing a semiconductor wafer.

FIG. 1 illustrates a block diagram of a system 100 of one embodiment for processing a semiconductor wafer. For purposes of illustration and not limitation, system 100 includes a grinder 102, a measurement device 104, and a processor 106 having a memory 108 associated therewith. Grinder 102 grinds a wafer and measurement device 104 measures data indicative of a profile of the ground wafer. The ground wafer at this point is unetched and unpolished (e.g., a pre-polished wafer). Alternatively, measurement device 104 may measure data indicative of a profile of the wafer after an etching process. Processor 106 is configured to provide feedback for adjusting a grinding parameter based on the measured data. For example, one or more of the grinding wheels of grinder 102 may be moved in order to improve the nanotopography of a wafer ground by grinder 102 before undergoing an epitaxial layer deposition process in an epitaxial layer deposition device 116.

In an alternative embodiment, system 100 includes a plurality of grinders 102, each grinding a wafer for further processing according to the system of FIG. 1. Measurement device 104 measures data indicative of profiles of the wafers ground by each of the plurality of grinders 102. Processor 106 is configured to provide feedback for each of the plurality of grinders 102 based on the measured data respectively corresponding to each of the plurality of grinders 102.

In this embodiment, system 100 includes one or more of the following post-grinding devices: an etching system 110 for etching the ground wafer, a surface measurement device 112 (e.g., a surface flatness measurement tool) for measuring the surface of the etched wafer, a polishing device 114 for polishing the etched wafer, the epitaxial layer deposition device 116 for depositing an epitaxial layer on the polished wafer, and a nanotopography measurement device 118 for measuring the nanotopography of the produced wafer.

Figure 2:
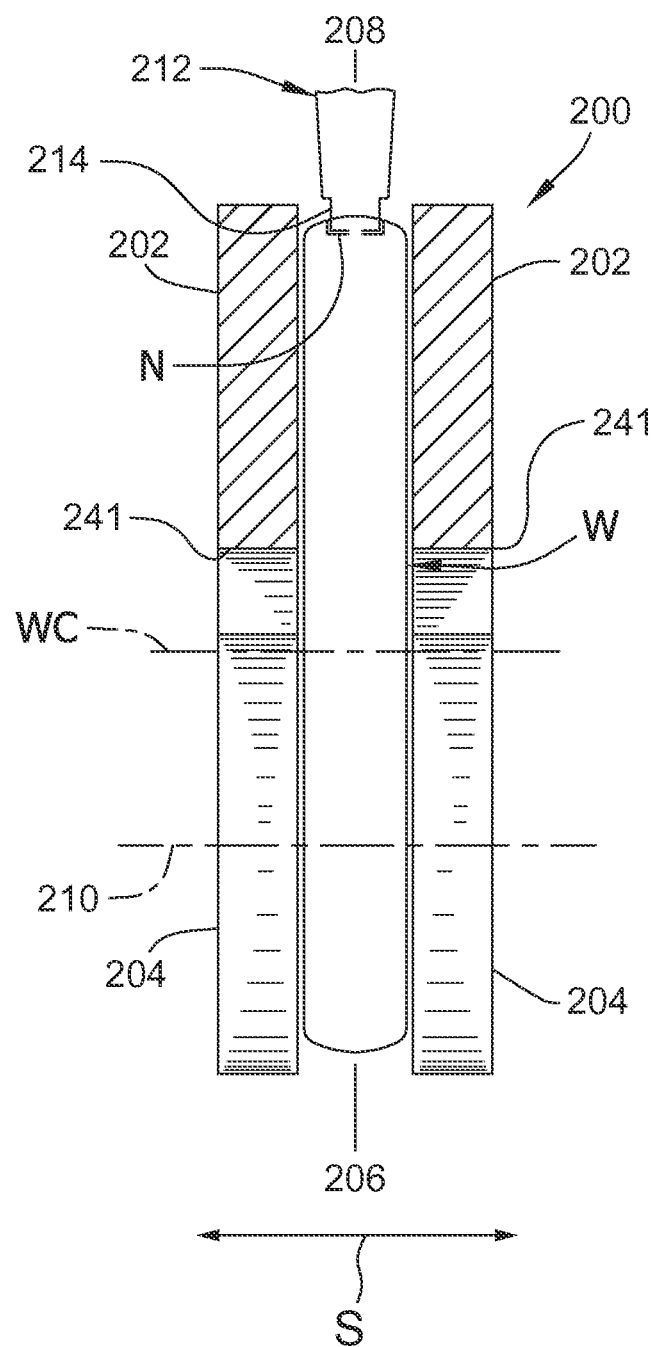
FIG. 2 is a schematic side elevation of a grinder having hydrostatic pads.

FIG. 2 illustrates a grinder 102 (e.g., a double sided grinder 200). Double sided grinder 200 includes a pair of hydrostatic pads 202 and a pair of grinding wheels 204. Grinding wheels 204 are substantially identical and each wheel 204 is generally flat. Grinding wheels 204 and hydrostatic pads 202 hold a semiconductor wafer W independent of one another to respectively define clamping planes 206 and 208. A clamping pressure of grinding wheels 204 on wafer W is centered at a rotational axis 210 of wheels 204, while a clamping pressure of hydrostatic pads 202 on the wafer is centered near a center WC of the wafer.

Hydrostatic pads 202 remain stationary during operation while a drive ring 212 moves wafer W in rotation relative to pads 202 and grinding wheels 204. Hydrostatic pads 202 may include hydrostatic pockets and fluid injection ports (not shown) that receive fluid from an external fluid source. The fluid holds wafer W vertically within pad clamping planes 206, 208, but still provides a lubricated bearing area, or sliding barrier, that allows the wafer to rotate relative to pads 202 during grinding with very low frictional resistance. Clamping force of pads 202 is provided primarily at the hydrostatic pockets.

In this embodiment, a detent 214 of drive ring 212 engages wafer W generally at a notch N formed in a periphery of the wafer to move the wafer in rotation about its central axis WC. At the same time, grinding wheels 204 engage wafer W and rotate in opposite directions to one another. One of wheels 204 rotates in the same direction as wafer W and the other rotates in an opposite direction to wafer W. As long as clamping planes 206 and 208 are held coincident during grinding, wafer W remains in plane (i.e., does not bend) and is uniformly ground by wheels 204.

Figure 3:
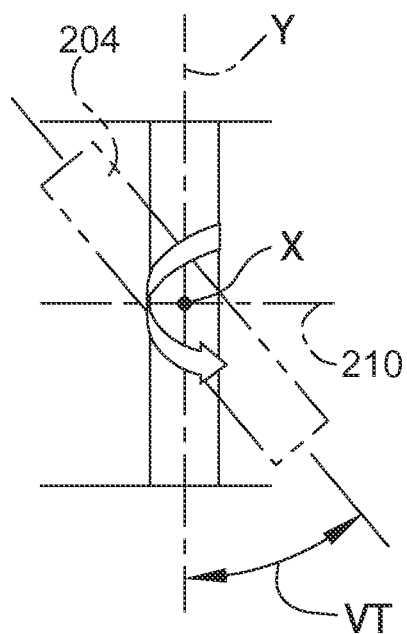
FIG. 3 is a schematic side elevation of the grinding wheel of FIG. 2 showing vertical tilt of the grinding wheel.
Figure 4:
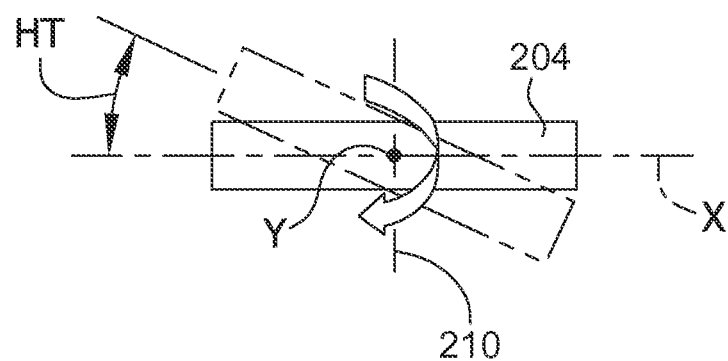
FIG. 4 is a schematic top view of the grinding wheel showing horizontal tilt of the grinding wheel.

Wheels 204 of this embodiment are adjustable in three orientations. As shown in FIG. 2 wheels 204 may undergo a lateral shift S relative to hydrostatic pads 202 in translation along axis of rotation 210. As shown in FIG. 3, a vertical tilt VT of wheels 204 may be adjusted about a horizontal axis X through the center of respective grinding wheels 204. As shown in FIG. 4, a horizontal tilt HT of wheels 204 may be adjusted about a vertical axis Y through the center of respective grinding wheels 204. These adjustments are exaggerated in the drawings to illustrate the concept, and it is understood that actual adjustment may be small, e.g., on the order of microns. In addition, each wheel 204 is capable of moving independently of the other so that horizontal tilt HT of the left wheel can be different from that of the right wheel, and the same is true for vertical tilts VT of the two grinding wheels 204.

In this embodiment, measurement device 104 is a warp measurement device 104 configured to interface with processor 106. Warp measurement device 104 obtains (e.g., detects) warp data for a wafer and measures the warp of the wafer based on the warp data. In one embodiment, warp measurement device 104 includes one or more capacitive sensors for obtaining the warp data. The obtained warp data is indicative of a profile (e.g., wafer shape) of the supported wafer.

Figure 5:
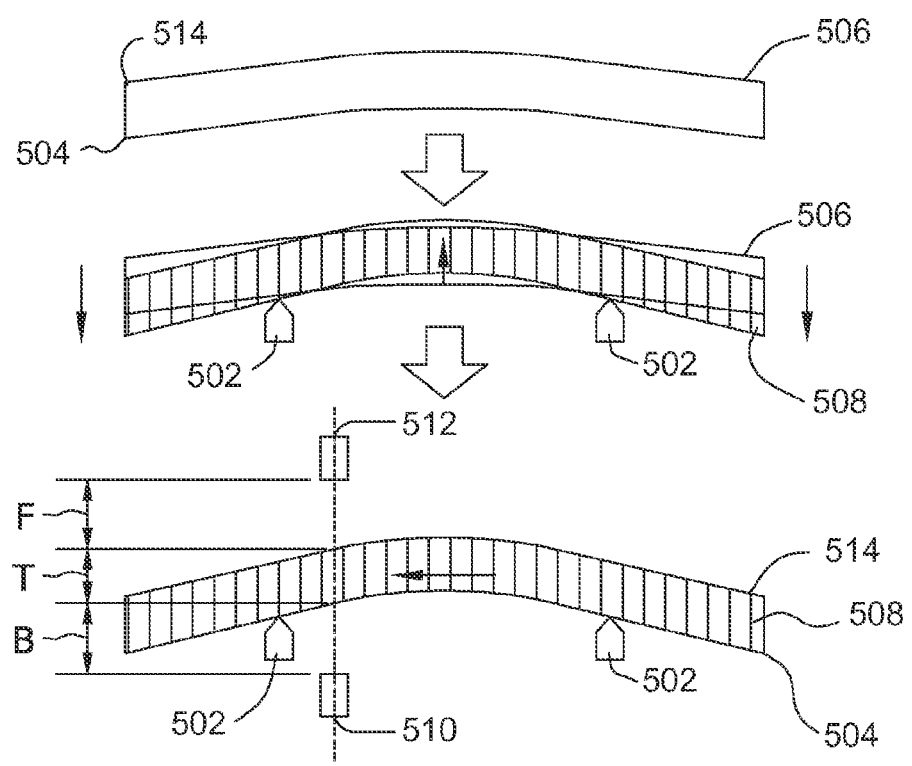
FIG. 5 is a diagram illustrating an line scanning process by a measurement device.

For example, warp measurement device 104 may execute a full wafer scan or a line scanning process as illustrated by FIG. 5. According to the line scanning process, wafer W is supported by one or more support pins 502 in contact with a first surface 504 of the wafer. As illustrated by a comparison between a shape of the wafer in a gravity-free state (indicated with reference number 506) to a shape of the wafer in the supported state (indicated with reference number 508), the shape of the supported wafer 508 is deflected as a function of gravity and a mass of wafer W. Warp measurement device 104 includes a first electrostatic capacitive sensor 510 for measuring a plurality of distances B between first sensor 510 and first surface 504 along a diameter of supported wafer 508. Similarly, warp measurement device 104 includes a second electrostatic capacitive sensor 512 for measuring a plurality of distances F between second sensor 512 and a second surface 514 (e.g., back surface) along a diameter of supported wafer 508. The obtained warp data includes a line scan data set corresponding to the diameter. The line scan data set comprises the plurality of distances measure by first sensor 510 along the diameter of supported wafer 508 and the plurality of distances measured by second sensor 512 along the diameter of supported wafer 508. The line scan data set is indicative of the wafer profile along the diameter.

Figure 6:
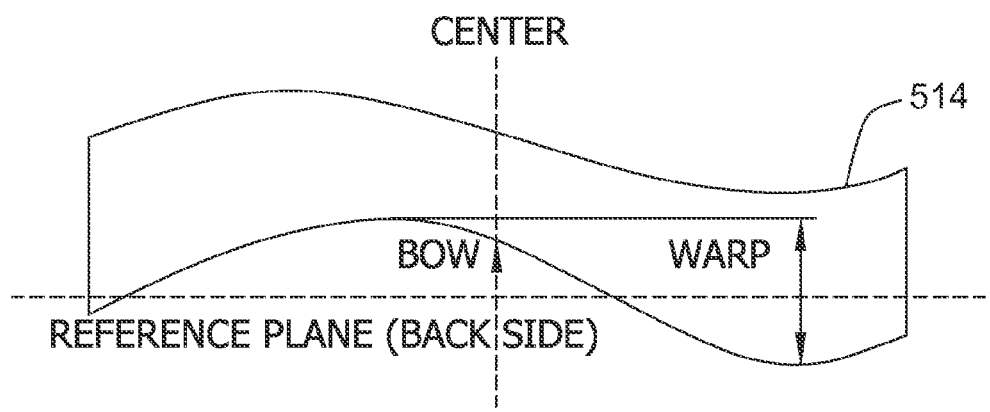
FIG. 6 is a side diagram of a wafer illustrating a warp parameter and a bow parameter of a wafer.

In this embodiment, warp measurement device 104 uses a "self mass" compensation algorithm to determine the wafer shape for gravity free state 506. The self mass compensation determines the shape of the wafer as a function of the line scan data sets, wafer density, an elastic constant, the diameter of the wafer, and the positions of support pins 502. Warp measurement device 104 measures one or more of the following: warp, bow, TTV (total thickness variation), and GBIR (global back surface ideal range). As shown in FIG. 6, warp and bow are generally determined with respect to a reference plane. The reference plane is defined as a function of the contact points between support pins 502 and first wafer surface 504. Specifically, warp is defined as the absolute value of the difference between maximum deviation and minimum deviation of the median area form the reference plane. The median area is a locus of points which are equidistance from wafer front surface 504 and wafer back surface 514. Bow is defined as the amount of deviation from the reference plane at the wafer center.

Referring again to FIG. 1, the data obtained by warp measurement device 104 for measuring warp and/or bow of the wafer is transmitted to processor 106. For example, the line scan data sets and/or the determined wafer shape may be transmitted to processor 106. Processor 106 receives the data and executes computer-executable instructions for performing a plurality of operations for processing the received data. In particular, processor 106 predicts the shape change of wafer W after an epitaxial layer deposition process based on the received data, determines warp and bow of the changed shape, and determines a grinding parameter based on the predicted shape of wafer W and determined warp and bow. The operation of grinder 102 is adjusted accordingly. For example, processor 106 may execute computer-executable instructions embodied in one or more software applications, components within an application or software, executable library files, executable applets, or the like. Storage memory 108 associated with processor 106 stores information and data for accessing by processor 106. For example, memory 108 may store data used by or accessed by processor 106, such as software, applications, data, or the like.

In one embodiment, storage memory 108 may be volatile or nonvolatile media, removable and non-removable media, and/or any available medium that may be accessed by a computer or a collection of computers (not shown). By way of example and not limitation, computer readable media include computer storage media that is any method or technology for storage of information such as computer readable instructions, data structures, program modules or other data. For example, computer storage media may include RAM, ROM, EEPROM, flash memory or other memory technology, CD-ROM, DVD or other optical disk storage, magnetic cassettes, magnetic tape, magnetic disk storage or other magnetic storage devices, or any other medium that may be used to store the desired information and that may be accessed by the computer.

Processor 106 and memory 108 may suitably be incorporated into one or more computing devices. As known to those skilled in the art, computing devices include a combination of the following: processor 106, one or more computer-readable media, an internal bus system coupling to various components within the computing devices, Input/Output devices, a networking device, and other devices. Exemplary computing devices include one or a combination of the following: a personal computer, a work station, a digital media player, and any other digital devices. In another embodiment, processor 106 accesses data stored by storage memory 108 via a network.

In one embodiment, processor 106 accesses a feedback program for processing the received warp data. The received warp data may include the line scan data sets and/or the determined wafer shape for the ground wafer. In particular, processor 106 predicts a shape of the wafer based on received data. The shape of the wafer is predicted, rather than actually measured, because when measurement device 104 device measures wafer W, the wafer has not yet undergone epitaxial layer deposition. Processor 106 determines one or more grinding parameters based on the predicted shape of the wafer. In one embodiment, processor 106 determines a shift parameter. The shift parameter is indicative of a magnitude and a direction for moving the pair of grinding wheels 204 in order to produce a desired wafer shape before wafer W undergoes epitaxial layer deposition. In another embodiment, processor 106 additionally or alternatively determines a tilt parameter. The tilt parameter is indicative of an angle for positioning the pair of grinding wheels 204 with respect to a wafer in order to produce a desired wafer shape before wafer W undergoes epitaxial layer deposition.

In this embodiment, the operation of grinder 102 is adjusted based on the determined grinding parameters. For example, grinding wheels 204 may be adjusted as specified by the determined shift and/or tilt parameters. In one embodiment, grinding wheels 204 are adjusted as a function of the determined shift and/or tilt parameters. Grinder 102 is configured to receive the determined grinding parameters and adjust one or more components of grinder 102 as a function of the determined grinding parameters. In another embodiment, the determined grinding parameters are provided to an operator and the operator configures grinder 102 to adjust one or more components of grinder 102 as a function of the determined grinding parameters.

Figure 7:
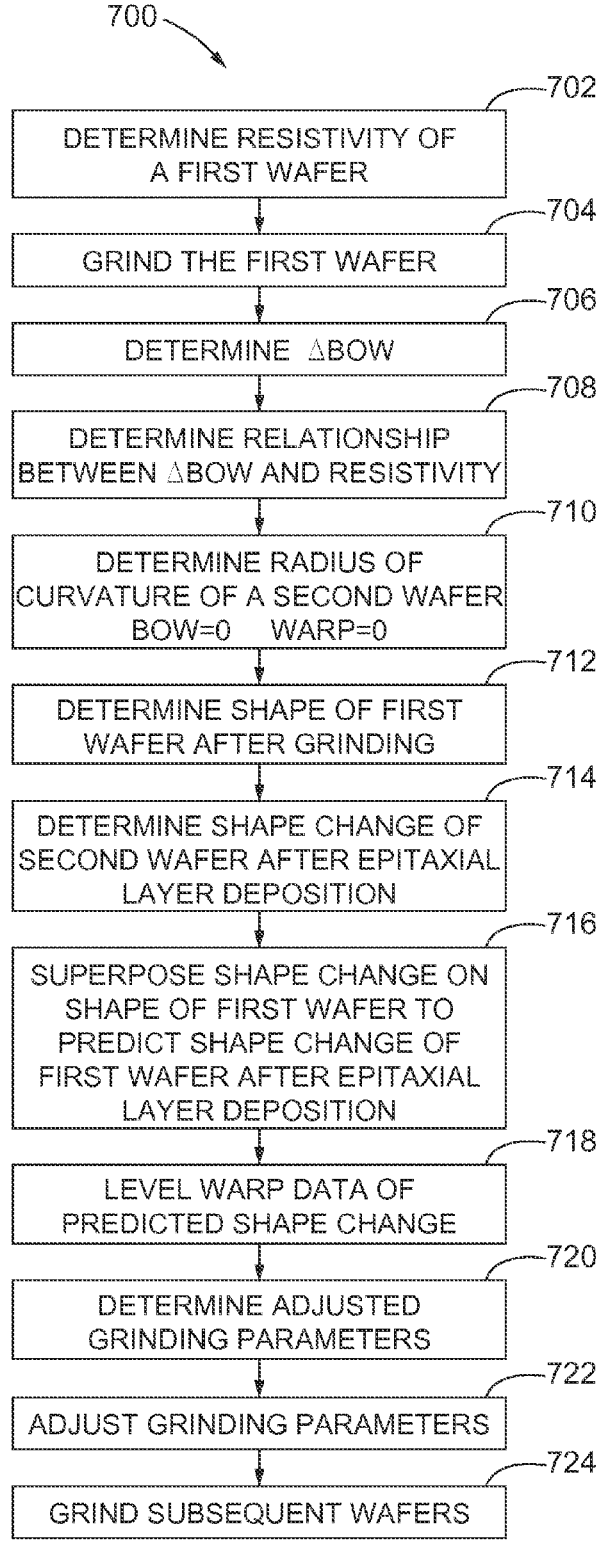
FIG. 7 is a block diagram illustrating one embodiment of a method for processing a wafer.

FIG. 7 illustrates a method 700 of processing a wafer. During processing, warp occurs from depositing an epitaxial layer on a wafer. The warp resulting from the epitaxial process cannot be controlled and depends largely on the wafer shape and wafer resistivity before the epitaxial process. A model or algorithm, described herein, is used to help predict post-epitaxial warp using measurement data measured after a grinding process and/or an etching process of the wafer. The predicted post-epitaxial warp data can then be used to adjust the grinding process and optimize post-epitaxial warp. For example, the epitaxial layer deposition process produces a positive bow in the wafer. The grinding process can be adjusted to produce a negative bow in the wafer substrate to counteract the produce positive bow.

In this embodiment, at 702, the resistivity of a first wafer is determined. Wafer resistivity depends largely on a dopant concentration of the formed wafer, and the resistivity can be measured using well known techniques and/or devices. At 704, grinder 102 grinds the first wafer. At 706, a change in bow between the bow before the epitaxial process and the bow after the epitaxial process is determined using stored data (e.g., historical empirical data). Wafer bow also depends largely on the dopant concentration of the formed wafer. At 708, processor 106 determines a relationship between change in bow and the resistivity of the wafer. In this embodiment, processor 106 determines the relationship between change in bow and resistivity to be $$\Delta Bow = 18.07 * resistivity,$$

where 'resistivity' is the resistivity of the wafer. At 710, processor 106 determines a radius of curvature of a second, substantially flat wafer (e.g., warp=0 and bow=0). In this embodiment, processor 106 determines the radius of curvature to be $$= \frac{3545.21}{(18.07 - 1139 * resistivity)},$$

where 'resistivity' is the resistivity of a given wafer.

At 712, the shape (i.e., a first profile) of the first wafer after the grinding process is measured using measurement device 104. Alternatively, the shape of the first wafer is measured using at least one of a capacitance device, a laser device and an interferometric probe device. At 714, processor 106 determines a shape change (i.e., a second profile) of the second wafer after an epitaxial layer deposition process using an appropriate radius of curvature (e.g., the radius of curvature determined at step 710). For example, the shape of the flat wafer is modeled using the determined radius of curvature. At 716, processor 106 superposes the second profile onto the first profile to predict a shape change (i.e., a third profile) of the first wafer after the epitaxial layer deposition process and to determine warp data associated with the third profile. At 718, processor 106 levels the warp data of the third profile to predict the post-epitaxial warp values of the first wafer (i.e., bow and warp). In one embodiment, the shape data is leveled using a least square fit to determine a predicted warp value of the first wafer. At 720, if the predicted warp value is above a predetermined threshold, processor 106 determines adjusted grinding parameters based on the predicted warp value to optimize and improve post-epitaxial warp of subsequent wafers to reduce warp in the final wafer products. At 722, processor 106 adjusts the grinding parameters of grinder 102. In this embodiment, processor 106 adjusts the horizontal tilt HT of grinding wheels 204 in parallel according to the determined grinding parameters. In this embodiment, processor 106 adjusts the horizontal tilt of grinding wheels 204 less than or equal to 3 microns. At 724, a subsequent wafer (e.g., a third wafer) is grinded by grinder 102 using the adjusted grinding parameters.

Described in more detail, step 708 determines a relationship between change in bow and resistivity of the wafer. As shown in FIG. 7, the relationship between resistivity and Δ Bow is plotted using stored data and yields the equation $$\Delta Bow = 18.07 * resistivity.$$

Figure 8:
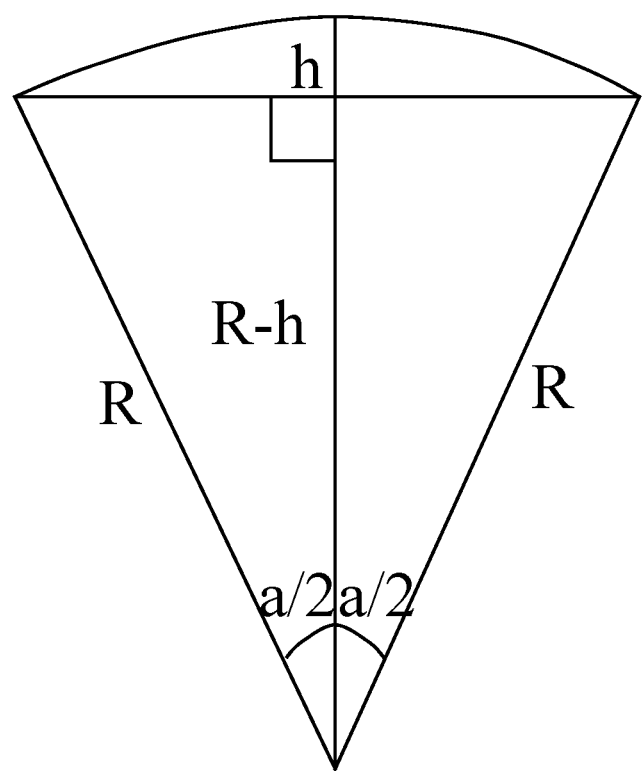
FIG. 8 is a schematic diagram illustrating geometric values used in determining the radius of curvature of a wafer.

With reference to FIG. 8, step 710 determines the radius of curvature 'R' by using geometrical calculations. As shown in FIG. 8, 'a' is the subtended angle and 'h' is a geometric parameter related to the radius of curvature of the wafer. During step 710, a first equation αR=diameter is established, where 'diameter' is the diameter of the wafer. In this embodiment, the diameter is 300. Using a second equation $$\cos\left(\frac{a}{2}\right) = \frac{R-h}{R},$$

a Taylor series expansion of cos is performed neglecting higher order terms (because 'a' is very small) to yield the equation $$\frac{a^2}{8} = \frac{h}{R}.$$

Substituting 'R' from the first equation yields a third equation $$a = \frac{2h}{75}.$$

In this embodiment, 'h' values are assumed in a least square level model to determine Δ Bow, and a plotted relationship between 'h' and Δ Bow using stored data yields the equation $$h = \frac{\Delta Bow}{0.3513}.$$

Using the first equation and the relationship between Δ Bow and resistivity, the radius of curvature 'R' is determined by the equation $$R = \frac{3545.21}{(18.07 - 1139 * resistivity)}.$$

Using the calculated radius of curvature, the change in shape of the flat wafer is modeled and superposed on the post-grinding shape of the first wafer to predict the post-epitaxial wafer shape, which can be used to make adjustments to grinder 102.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A method of controlling warp in a plurality of wafers that are subject to an epitaxial layer deposition process, the method comprising:
    receiving, by a processor, a measured shape of a first wafer of the plurality of wafers after at least one of a grinding process and an etching process of the first wafer;
    predicting, using the processor, a warp value in the first wafer after the epitaxial layer deposition process, wherein predicting the warp value includes:
        calculating, using the processor, a change in wafer shape during the epitaxial layer deposition process; and
        superposing, using the processor, the calculated shape change onto the measured shape of the first wafer to determine a post-epitaxial wafer shape;
    adjusting a simultaneous double side wafer grinder based on the predicted warp value; and
    grinding a second wafer of the plurality of wafers with the wafer grinder.

2. The method of claim 1, wherein said adjusting a simultaneous double side wafer grinder comprises adjusting at least one of a horizontal tilt and a vertical tilt.

3. The method of claim 2, wherein said adjusting a simultaneous double side wafer grinder comprises effecting a parallel change in horizontal tilts of the wafer grinder.

4. The method of claim 1, wherein said adjusting a simultaneous double side wafer grinder comprises adjusting at least one of a left side wheel and a right side wheel of the wafer grinder.

5. The method of claim 1, wherein said predicting a warp value in the first wafer after the epitaxial layer deposition process further comprises:
    receiving, by the processor, a measured resistivity of the first wafer;
    and
    calculating, using the processor, a post-epitaxial warp value based on the determined post-epitaxial wafer shape.

6. The method of claim 5, further comprising determining, using the processor, a bow difference between a post-epitaxial bow of the first wafer and a pre-epitaxial bow of the first wafer.

7. The method of claim 6, wherein said calculating a change in wafer shape comprises calculating, using the processor, a change in wafer shape during the epitaxial layer deposition process using the determined bow difference.

8. The method of claim 7, wherein said determining a bow difference comprises determining, using the processor, a bow difference between a post-epitaxial bow of the first wafer and a substrate bow of the first wafer using the equation $$\Delta Bow = 18.07 * \text{resistivity},$$

wherein 'resistivity' is the measured resistivity.

9. The method of claim 5, further comprising determining, using the processor, a radius of curvature of a third wafer using the measured resistivity.

10. The method of claim 9, wherein said calculating a change in wafer shape comprises calculating, using the processor, a change in wafer shape during the epitaxial layer deposition process using the determined radius of curvature.

11. The method of claim 10, where said determining a radius of curvature of a second wafer comprises determining, using the processor, a radius of curvature of a third wafer using the equation $$R = \frac{3545.21}{(18.07 - 1139 * \text{resistivity})}$$

where 'resistivity' is the measured resistivity.

* * * * *